United States Patent

[11] 3,632,431

[72] Inventors Elie Andre; Jean-Marc Le Duc, both of Caen, France

[21] Appl. No. 769,319
[22] Filed Oct. 21, 1968
[45] Patented Jan. 4, 1972
[73] Assignee U.S. Philips Corporation New York, N.Y.
[32] Priorities Oct. 20, 1967
[33] France
[31] 125280; Oct. 20, 1967, France, No. 125281; Dec. 29, 1967, France, No. 134421; Dec. 29, 1967, France, No. 134422

[54] METHOD OF CRYSTALLIZING A BINARY SEMICONDUCTOR COMPOUND
17 Claims, 6 Drawing Figs.

[52] U.S. Cl. .......... 117/201, 23/301 SP, 23/273, 117/106 A
[51] Int. Cl. .......... H01l 7/00, H01l 7/38
[50] Field of Search .......... 117/201, 106 A; 148/172; 23/300, 301 SP

[56] References Cited
UNITED STATES PATENTS
3,198,606 8/1965 Lyons .......... 23/301 X

*Primary Examiner*—William L. Jarvis
*Attorney*—Frank R. Trifari

ABSTRACT: A method of crystallizing a binary semiconductor compound from a liquid solution of the compound in one of its components, e.g. gallium arsenide in gallium. A small quantity of an element of the same group of the periodic system of the elements as that component, but having a larger atomic radius, e.g. indium, is added to the solution. The binary compound can be epitaxially deposited on the surface of a semiconductor body.

Instead of gallium arsenide, indium arsenide may be crystallized using thallium as an addition. Moreover, a crystalline body can be obtained by drawing. The added component can be introduced in a vapor phase or through a porous wall. Crystallization may also take place by a zone melting process.

INVENTORS
ELIE ANDRE
JEAN-MARC LE DUC
BY Frank R. Jinfani
AGENT

INVENTORS
ELIE ANDRES
BY JEAN-MARC LE DUC
AGENT

INVENTORS
ELIE ANDRE
BY JEAN-MARC LE DUC
Frank R. Trifari
AGENT

METHOD OF CRYSTALLIZING A BINARY SEMICONDUCTOR COMPOUND

The invention relates to a method of crystallizing a binary semiconductor compound from a liquid solution of the compound in one of its components and to a semiconductor device employing a semiconductor body which consists at least partly of a semiconductor compound obtained by using the method.

In addition to the known semiconductor materials belonging to group IV of the periodic system of the elements, for example, silicon or germanium, certain composite materials are also used as semiconductors. The composite materials usually consist of an element of group III alloyed with an element of group V, sometimes of an element of group II alloyed with an element of group VI and sometimes even of an element of group IV alloyed with an element of group VI. Gallium arsenide, gallium phosphide, indium arsenide, indium antimonide, some selenides, tellurides and so on are known for their semiconductive properties.

The above list is not restrictive but it has been found that in all the cases the characteristics of the semiconductor device manufactured with one of these materials depend upon the crystal quality of the single crystal used.

It is known that one of the methods used for manufacturing semiconductor crystals of a very good quality or of a particular shape, which are mainly destined for electronic devices which operate at very high frequencies, for example, devices with Gunn effect and lasers, is the method of epitaxial deposition according to which a regular crystal layer is made to grow on a single crystalline support, termed substrate, which elongates the crystal lattice of the said substrate by substantially reproducing it. For example, this method is normally used for manufacturing surface layers of gallium arsenide having certain characteristics.

Certain devices require a semiconductor body or a semiconductor layer of high purity which ensures a maximum mobility of the charge carriers. Some devices require a completely determined strong concentration of carriers and a mobility of the charge carriers which is also maximum at any temperature. It must be capable of controlling these characteristics by means of the method and the results must be reproducible. In all the cases the best and correct characteristics can be obtained with a crystal lattice which is without any defects.

In order to deposit a layer of a binary compound which substantially satisfies the above-mentioned requirements on a substrate, it is known inter alia to use so-called vapor phase methods, according to which on the substrate which is held at a constant temperature a vapor is deposited which contains the constituents and, if required, a doping impurity which either are transported by a suitable gas which flows through the reaction space, or are formed at different points in a closed space starting from sources which are kept at the required temperatures. In these methods it is necessary to bring the various parts of the reaction space at different temperatures and the space itself must usually have a composite shape so as to ensure the correct currents of the vapor and the gas.

So the use of the methods with the vapor phase turns out to be delicate and necessitates an apparatus which is also delicate.

Moreover, the growth of the deposition proceeds very slowly.

Other methods using the liquid phase have also been used already in particular to obtain layers or bodies having a strong content of impurities or to obtain so-called compensated layers or compensated bodies of a composite semiconductor compound.

These methods employing the liquid phase consist of introducing into a space on the one hand a substrate and on the other hand the constituents of the solution of the composite compound. These constituents are brought at a temperature which is sufficient for a complete dissolution and a device is provided for subsequently coating the substrate with the liquid solution, after which cooling takes place. In these methods, the preferred solvent used is one of the constituents of the said composite compound or otherwise a metal which is meltable at a sufficiently low temperature, but the unavoidable introduction of which into the deposit produces a strong impurity, doping, of which it may be necessary that it is compensated by introducing impurities which supply the opposite conductivity type. In order to obtain a noncontaminated deposit, or a deposit which contains a given impurity which cannot play the part of a solvent, the methods with the liquid phase employ a solvent in the constituent the melting temperature and the vapor pressure of which are lowest.

It has been found that the methods of depositing composite semiconductor compounds from the liquid phase are performed more rapidly than the methods with the vapor phase since the required operations, and the apparatus, are simpler, but so far these methods have not resulted in deposits which also show the above qualities aimed at, for example, the purity and the absence of crystal defects. The deposits obtained with these methods show many defects; for example a particularly large amount of gallium inclusions are observed when a gallium-arsenide deposit is made to grow on a substrate which is oriented according to the 1,0,0 crystal face starting from a solution of gallium arsenide in gallium.

It is known that the rate of growth of a layer or body in most of the cases depends upon the crystal orientation of the substrate, in which the nucleation properties of the various crystal faces are not the same. In the case of gallium arsenide, for example, a deposit on a surface which is oriented according to the 1,0,0 face of the crystal lattice and of which the growth of the deposit is directed at right angles to said face, grows more rapidly and shows more irregularities and defects than a deposit on a substrate which is oriented according to the 1,1,1, face. When growing in layers which are oriented according to the 1,0,0 face, numerous gallium inclusions appear. When growing in layers which are oriented on a substrate according to the 1,1,1 face, these defects are less numerous but the growth on a substrate which is oriented according to the 1,0,0, face is the only one in this case with which, by division a more rational shape and disks with an interesting geometry can be obtained, the treatments in all stages of the manufacture and control of devices being facilitated, With this 1,0,0 face only gallium arsenide disks can be obtained having orthogonal faces which are required, for example, for a laser device. The requirements for division also prevent the consideration of an improvement of the deposit by the known method which consists of directing the substrate in such manner that it encloses an angle of a few degrees with one of the crystallographic main surfaces.

It is found possible on the contrary to improve the growth of a deposit or of a body by improving the fluidity of the solution from which the deposit is formed. It would seem easy to obtain this improvement by providing said deposit at a higher temperature of the solution. On the contrary, however, by raising the temperature crystal defects can be introduced as a result of which the purity of the deposit is reduced by vapor pressures and diffusion coefficients of the possibly undesired impurities which rapidly increase with temperature.

The said drawbacks of the known methods have often been found in layers formed by epitaxy on a substrate. However, they are not restricted to this but generally apply to the crystallization of binary semiconductor compounds.

It is one of the objects of the invention to avoid the above-mentioned drawbacks. The invention is based on the discovery that, for improvement, with a view to the growth, the thermodynamic and mechanical properties of the solution of the composite compound in the constituent meltable at the lowest temperature in which a dissolving and deposition temperature is maintained which is as low as possible, a small quantity of a substance of the same valency as the solvent but having a larger atom radius may be added to the said solution, which addition does not cause doping of the epitaxial layer.

The method described in the preamble is therefore characterized in that a small quantity of at least one element of the same group of the periodic system of the elements as that component but having a larger atomic radius is added to the solution.

The quantity added according to the invention is qualified as being small since this quantity must remain below any quantity which is capable of causing the presence of the added element to appear in the deposit by a corresponding alteration of the main electric and crystallographic characteristics of the said deposit, for example, of the emission wavelength in the electroluminescent device. By thus restricting the quantity of the element added to the said solution, the said element merely occurs in the solution and improves the quality of the deposit without varying its nature.

It will be obvious that the addition of a small quantity is to be understood to mean a quantity which is small relative to the quantity of the solvent, for example, at most in the order of 10 percent by weight. The semiconductive compound is preferably provided epitaxially on a semiconductor body. It also turns out to be of advantage, when the semiconductor body consists of the semiconductor compound.

In a preferred embodiment of the method according to the invention the starting material is a liquid solution of an $A^{III},B^{V}$-compound in the $A^{III}$-component, the added element being an element of the third group of the periodic system and having a larger atomic radius than the $A^{III}$-component. Particularly favorable results are obtained when the starting material is a liquid solution of gallium arsenide in gallium. The concentration of gallium arsenide with respect to the gallium is preferably chosen between 3 and 20 percent by weight, particularly between 5 and 10 percent by weight.

The added element in the solution of the gallium arsenide in the gallium may be, for example, one of the elements of the so-called lanthanides group. The added element preferably is indium. Particularly suitable concentrations of the indium relative to the gallium are below 5 percent by weight, preferably between 1 and 3 percent by weight. With such a concentration the presence of indium in the gallium arsenide is not noticeable. In an optoelectronic device, for example, a laser diode the junction of which has thus been manufactured, the emission wavelength of the gallium arsenide has not been shifted.

Due to the fact that its radius is larger than that of the atom of the component used as a solvent, the atom of the element added to the solution according to the invention cannot easily be introduced in the crystal lattice during crystallization and the quantity introduced into the liquid is not found again in the crystal. Thus it is known that, in the case of the above example, in order to obtain a mixed crystal of gallium arsenide and indium arsenide with a small content of indium starting from a liquid, it would have been necessary to use a high indium content in the liquid for this purpose.

On the contrary it may be assumed that also due to its larger atom radius, the said element tends to destroy the ion structures which are present in the solution and thus improves the reorientation possibilities of the atoms according to the crystal lattice at the area of the interface solid liquid. Thus, with the said concentration, the presence of the said element in the solution renders same more favorable for crystallization while the crystal quality of the deposit is significantly improved.

The weight of the dissolved composite compound with respect to the weight of the solvent determines the saturation condition of the solution. Said weight can be established according to the conventional conditions of crystallization from the liquid phase, taking into account that the melting temperature, at which the components used melt completely, corresponding to at least the saturation temperature of this solution, must preferably be as low as possible.

In a preferred embodiment of the invention certain quantities of the components of the solution are placed in a space in which also a semiconductor body is placed, under a neutral or reducing atmosphere in such a position that the component can be melted without contacting the said semiconductor body. After complete melting, dissolving and homogenizing the solution at a suitable temperature, the liquid solution is brought at the saturation temperature and contacted with the surface of the semiconductor body on which the deposit is to be provided, after which the epitaxial deposit is obtained by programmed cooling.

The temperature at which the components of the solution are brought and the period during which they are kept at said temperature prior to cooling to the saturation of the solution and deposit depend upon the necessary homogenization of the solution prior to the said deposit. This temperature preferably lies 20° to 50° C. above the saturation temperature of the solution. The rate of cooling preferably lies between 0.1° and 50° C. per minute. An epitaxial layer which is destined for a device in which a high degree of purity is required, provided in accordance with the invention according to the above-mentioned embodiment on a flat semiconductor body of which the surface, on which the deposit is provided, is oriented according to a crystallographic main plane, shows a flat and very regular surface and an interface epitaxy substrate which is likewise flat and very regular. The deposit shows no undesired inclusions. The purity of the deposit is provided without a doping impurity is excellent and the deposit has properties which are better than those of deposits which are provided according to the known method. It is possible to obtain very low concentrations of the charge carriers simultaneously with a mobility of the charge carriers which is at least equal to the highest values which have so far been obtained with other methods, for example, epitaxy from the vapor phase.

According to another embodiment of the invention one or more doping impurities are added to the components of the solution. In this case also the deposit shows a crystal quality which is considerably improved relative to the deposits which are provided without any addition to the solution of one of the recommended elements according to the invention.

An electroluminescent diode of gallium arsenide, obtained by epitaxy from a solution to which indium has been added, has a better efficiency according to the invention due to the high crystal quality obtained. It has also been found that with the improvement of the crystal quality obtained, an increase of the laser effect, a decrease of the threshold of the laser effect, and an improvement of the optoelectronic coupling can be obtained. Besides, with the longer lifetime of the charge carriers obtained in the deposited layers, so-called integrated electronic devices can be manufactured.

The method according to the invention moreover enables a high crystal quality to be obtained, even for very thick layers which may be used, for example, as a substrate after removing the original substrate. It is to be noted that with the method according to the invention, the advantages are maintained of simplicity, speed and lower cost of epitaxy from the liquid phase but with much better results, particularly from a point of view of crystallography, which results could so far not be obtained with methods which are more complicated, more delicate or slower. Actually, the method according to the invention fully uses the properties of the solvent of the component used as such, in which solvent the undesired impurities rather remain than that they penetrate into the deposited layer.

The use of the addition to the solution is particularly suitable in another preferred embodiment of the method in which a crystalline body is obtained from the semiconductor compound by drawing from the solution. In the method according to the invention the concentration of the component other than the solvent in the melt is kept up to the mark, preferably during crystallization since the other component is placed at a location in the solution where a higher temperature prevails than at the location where crystallization takes place. As a result of this the formation of a crust in the melt is prevented at the area where the other component is brought in the melt, particularly near the surface of the solution where it contacts an atmosphere which contains the other component in a vapor form. Since in this case the addition according to the invention is present, for example, indium during the crystallization of gallium arsenide, this method is particularly suitable to obtain large crystals of the compound.

An embodiment in which the other component is introduced into a crystallization vessel in which crystallization takes place through a porous wall has proved particularly suitable. According to a further preferred embodiment of the method crystallization takes place in a zone melting process.

The invention will now be described with reference to the accompanying drawing, in which FIG. 1 is a diagrammatic cross-sectional view of a crucible and a space prior to obtaining the liquid phase.

Figure 1:
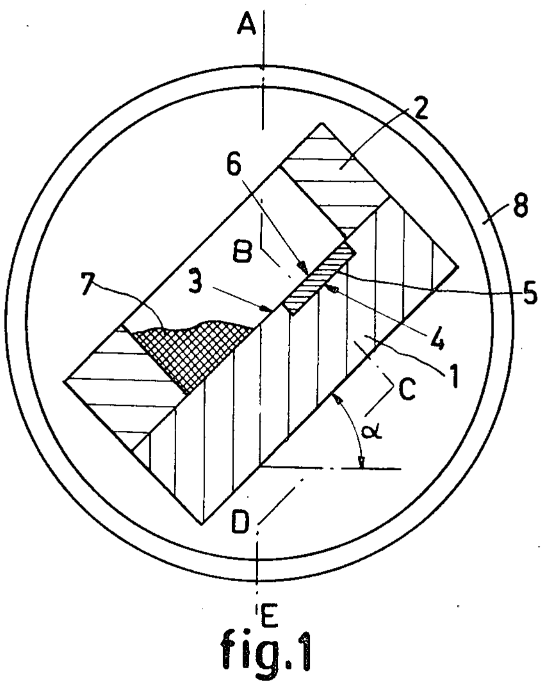

The crucible in which the epitaxy is carried out must contain, in a first step, on the one hand the components which are destined for the solution of the liquid phase and on the other hand the disk which is to serve as a substrate. After melting and dissolving in a second step it must be possible to contact the solution with the surface of the substrate. The crucible shown in FIGS. 1 and 2 consists, for example, of graphite and preferably comprises two parts 1 and 2 the object of which will be described hereinafter. It comprises a bottom 3 in which a cavity 4 is recessed in which the substrate 5 is provided in such manner that the surface of the deposit 6 reaches the same level as the bottom 3. This construction facilitates the coating of the surface of the substrate by the liquid during placing the crucible for epitaxy. Originally the crucible is arranged at an inclined angle $\alpha$ so that it can be filled with gallium, indium and gallium arsenide 7 in a solid form without said filling contacting the substrate. In the same position the crucible is inserted into a horizontal tube 8 and, for example, a hydrogen atmosphere is created in said tube, after which the tube is brought at a temperature at which all the gallium arsenide dissolves. This temperature which lies considerably above the saturation temperature is maintained during a time which is necessary for the complete solution and homogenization, the liquid being not in contact with the substrate during this process.

Figure 2:
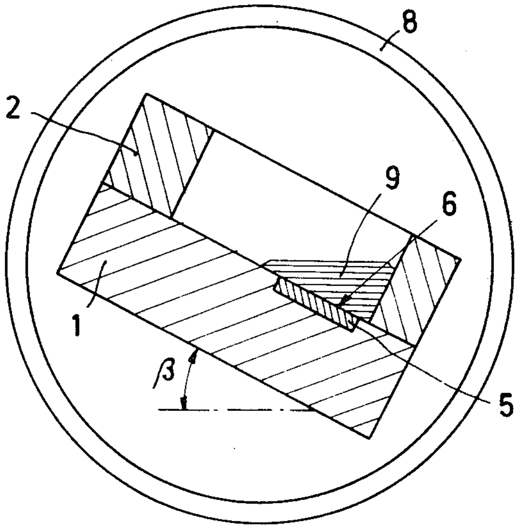
FIG. 2 is a diagrammatic cross-sectional view of the crucible in the same space during epitaxy.

The crucible is then rapidly brought to a temperature, which lies rather near the saturation temperature, and is then tilted in the other direction according to an angle $\beta$ (FIG. 2).

The solution denoted by 9 thus covers the whole surface 6 of the disk 5. This process and the subsequent cooling are carried out without any noticable interruption in such manner that a considerable extent of dissolution of the substrate is avoided. The actual epitaxial deposit is obtained by slow and controlled cooling of the assembly of tube and crucible.

Figure 3:
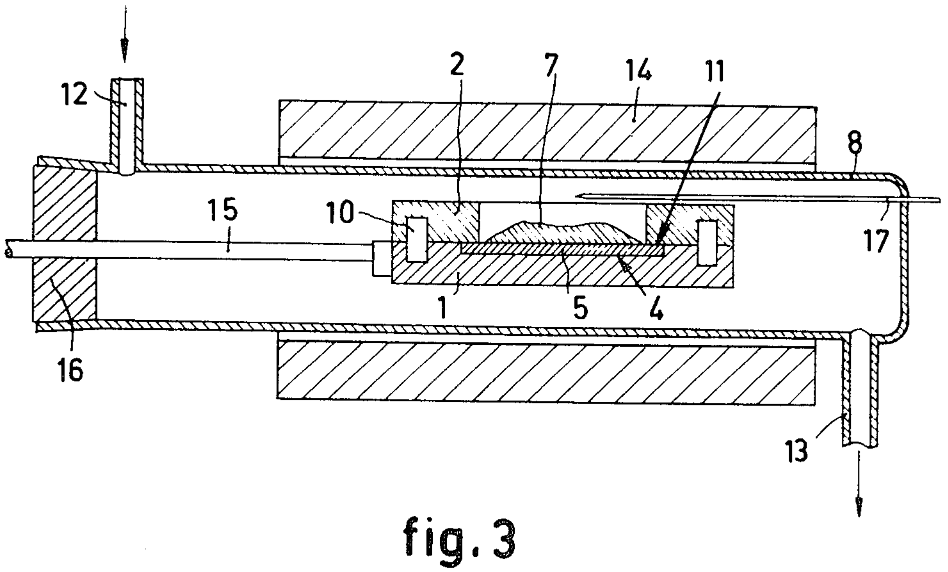
FIG. 3 shows a simplified longitudinal cross-sectional view of the assembly of the apparatus in which the crucible and the space are shown in a cross section taken on the line ABCDE of FIG. 1.

FIG. 3 shows an example of an assembly for carrying out the method. The two parts 1 and 2 of the crucible are held together by lugs 10. As a result of the construction of the crucible in two parts the disk 5 can be immovably held in its place 4 by a cover 11 at the ends. The region of the tube 8 in which the crucible is placed is evenly heated by a tubular oven 14. A stream of hydrogen flows through the tube 8, entering the tube at 12 and leaving the tube at 13. Tilting of the crucible from the inclination $\alpha$ to the inclination $\beta$ is carried out by means of a rod 15 which is secured to the crucible and projects through the tube via an airtight lead-in member 16. The temperature of the bath is measured by means of a thermocouple 17 the indications of which are transferred to a programming device not shown.

Of course the shape of the crucible and the proportions of the cavity 4 depend upon the dimensions of the substrate disks. The crucible shown consists of two parts which facilitates the manufacture, but crucibles consisting of quartz, ceramic or any other suitable material which may or may not consist of one or several parts may alternatively be used. It is to be noted that for the method according to the invention, only an oven with a single heating region is necessary which can much more easily be manufactured and controlled than the multiple regions necessary in the methods from the vapor phase.

The weight of the dissolved gallium arsenide which determines the saturation temperature of solution is established in accordance with the conventional conditions for epitaxy from the liquid phase. In most of the cases this weight will preferably lie between 3 and 20 percent of the weight of the gallium used as a solvent; in particular this ratio lies preferably between 5 and 10 percent at least for a solution which contains a doping impurity.

The temperature at which the components of the solution are heated and the time during which they are kept at this temperature prior to cooling to saturation of the solution and deposit depend upon the required homogenization of the solution prior to the said deposit. This temperature preferably lies 20°–50 C. above the saturation temperature of the solution. At least in the case in which a solution contains no doping impurities, the temperature lies preferably between 850° and 920° C.

The manufacture according to the invention of an epitaxial deposit of high quality on a gallium arsenide disk which is doped with chromium of a semi-insulating quality the surface of which is oriented according to the crystal face 1,0,0 by means of an apparatus as has just been described, will now be described by way of example.

The surface of the disk having an area of 3 sq.cm. is prepared according to the conventional methods, in this case by polishing and a slight chemical etching treatment. The disk is then placed and secured in a crucible as described above, in which also the components of the solution are introduced which are constituted by 20 gms. of gallium of 99.9999 percent, 1.6 gms. of gallium arsenide crystals obtained according to the method of Bridgman and 0.4 gm. of indium of 99.9999 percent. A ratio of approximately 2 percent by weight of indium relative to gallium is thus obtained in the solution and a possibility of complete dissolution of the gallium arsenide at the temperatures of 850° C. and 820° C. to be considered hereinafter. This filling contains no doping impurity.

The crucible is introduced into a quartz tube in the position shown in FIG. 1. The stream of hydrogen which may be replenished with nitrogen, if required, in any ratio is introduced into the tube. The temperature of the charge and of the substrate is first heated to 850° C. and kept at this value for at least 3 hours. Then it is cooled to 820° C. and the crucible is tilted into the position shown in FIG. 2. The solution of gallium, arsenic and indium flows on the surface of the disk and covers it entirely. The temperature is then lowered from 820° C. at a rate of 1° per minute by the temperature programming device, the crucible being kept immovable.

After a first stage, during which the solution dissolves the substrate superficially up to the saturation of the solution of the interface substrate liquid, the epitaxial deposit is effected. At a temperature of 740° C. the crucible may be allowed to cool normally and finally the disk is taken out and in this case cleaned by any conventional method. The thickness of the deposit is 50 microns but of course smaller or larger thicknesses can be obtained by a similar method. The epitaxial deposit obtained in the above conditions has the following properties: mobility 8,500 $cm.^2\ V^{-1}S^{-1}$ at 300° K. an 105,000 $cm.^2\ V^{-1}S^{-1}$ at 80° K. measured with a magnetic field of 1.4 k. gauss, concentration of free charge carriers $\mathbf{10^{14}}/cm.^3$, substantially independent of the temperature. It has substantially no microscopic defects nor gallium inclusions at the surface and the interface epitaxy substrate is very flat.

In case the deposited layer is to be doped the method according to the invention need not be changed essentially. The doping impurity may be zinc or tellurium, in which the conductivity types $p$ and $n$, respectively, are obtained, or any other impurity which is used in this case.

So-called compensated layers may also be obtained under the same circumstances, for example, by the simultaneous addition of zinc and tellurium to the solution or also by the addition of an amphoteric impurity, for example, silicon. The doping impurity is added to the components of the solution in quantities which are analogous to those which are used in epitaxy from the liquid phase by known methods. A laser diode manufactured according to the method of the invention by the epitaxial deposition of a doped layer on a substrate of gallium arsenide of the opposite conductivity type, produces an emission with a wavelength corresponding to that of gallium arsenide obtained according to the conventional methods.

Figure 4:
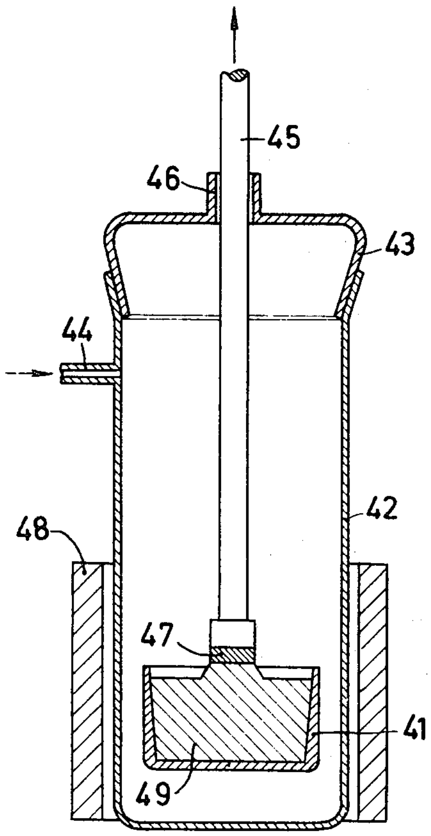
FIG. 4 is a diagrammatic and simplified vertical cross-sectional view of a device for performing the method by drawing.

In the embodiment of the method to be described with reference to FIG. 4, the whole solution which is necessary for a deposition process is formed in a crucible 41 which is placed in a space 42 closed by a cover 43. A gas which in most of the cases preferably is a reducing gas, for example, hydrogen, is introduced into the space 42 through the tube 44. A vertical rod 45 which projects through the cover 43 via a lead-in member 46 with some play through which the excess of gas escapes from the space, supports at its lower end a monocrystalline substrate 47 on which the deposit is provided and which plays the part of a nucleus for the considered elongated crystal growth. A certain temperature gradient is obtained in the crucible 41 by means of a heating device 48 from the bottom of the crucible up to the level of the deposit on the substrate 47.

If the solution 49 consists, for example, of a solution of gallium arsenide in gallium to which according to the invention a small quantity of indium, for example, 1.3 percent of the weight of gallium, has been added its temperature is maintained in the proximity of the surface at approximately 860° C. After contacting the gallium arsenide substrate 47 with the solution, drawing is carried out as in the known method of drawing single crystals according to the so-called Czochralski method. The vertical temperature gradient in the solution is such that migration of arsenic takes place, in this case from the bottom in the crucible upwards, the arsenic has the tendency to diffuse to the interface solid liquid, and the solution is depleted progressively in arsenic. The deposition and the drawing may be continued until the content of the solution becomes insufficient.

In order to check the depletion, particularly in the case of a very volatile constituent of the solution, it is possible to use a similar device which is closed entirely and in which an excess of this constituent placed in a region having a temperature which is lower than that of the deposit, maintains the required pressure.

The addition to the solution 49 improves the deposit, the migration through the solution being facilitated and the crystal growth being favored, without penetrating into the crystal lattice of the deposit. The volume of the resulting deposit depends upon the mass of the constituents used and the sufficient possibilities of presence in the crystallization region of the component other than the solvent.

Figure 5:
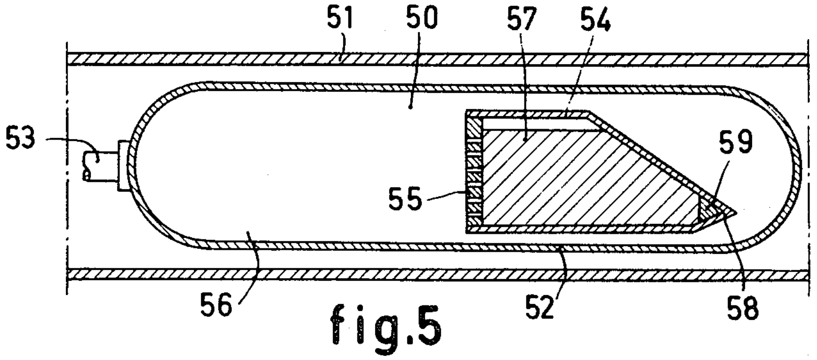
FIG. 5 is a diagrammatic and simplified horizontal cross-sectional view of a device for performing the method with simultaneous synthesis.

In the third embodiment of the method according to the invention which is described with reference to FIG. 5 liquid volatile component is continuously added to the solution and this component is transferred by diffusion through the solution to the interface solid liquid.

This device is of the horizontal type and comprises a tubular oven 51, in which an airtight closed tube 52 can be moved, for example, by means of a rod 53. A boat 54 is placed in the tube 52 and constitutes a reaction space which is closed by a wall 55 the lower part of which is porous. Through this part contact is obtained between the vapor of the soluble component from a source 56 and the liquid solvent 57 to which is added according to the invention a small quantity of an element of the same group and a larger atom radius which nearly entirely fills the boat 54 the other end 58 of the boat being conical and comprising a monocrystalline substrate 59 on which the deposit is provided.

By means of the oven 51 a temperature gradient is obtained in the closed tube 52 according to its axis. This gradient is such that the source 56 is kept at a temperature which ensures a sufficient vapor pressure; the vapor of the volatile component flows through the region 50 with a positive temperature gradient and diffuses in the solvent through the porous wall 55. The mass of the solution thus formed is kept at a high temperature but the oven 51 is constructed so that the solution shows a decreasing temperature gradient, towards the crystallization region, the interface solid liquid being kept at the crystallization temperature. In accordance with the crystal growth, in which an increase of the thickness of the deposit in a substantially horizontal direction is obtained, the space 52 is moved progressively in the tube 51.

In this example, the migration of the component dissolved via the liquid phase constantly renews the solution and the element added to the solution according to the invention and which does substantially not deposit in the crystal lattice of the epitaxial layer and remains in the solution in a substantially unaltered ratio, favors this migration and improves the thermodynamic activity of the solution at the area of the interface solid liquid.

The fourth embodiment of the method according to the invention which will be described with reference to FIG. 6 resembles the so-called zone melting method which is used for the manufacture or purification of single crystals. In this embodiment a vertical device has been chosen but this device is not necessary.

The solution is obtained and maintained simultaneously with the epitaxial deposit by progressive dissolution of a starting mass 21 of the binary compound which is deposited, for example, in the form of polycrystalline rods. This mass is placed in a vertical tube 22 which can be closed but through which also a current of a reducing gas, for example, hydrogen, can be led at 23; it is also possible that a very low vapor pressure of the most volatile component is maintained at 23.

The tube 22 has a conical lower end 24 and comprises a monocrystalline nucleus 25 which serves as a substrate for the deposit. Above this substrate there is the solution 26 of the compound in one of its components which according to the invention is replenished with a small quantity of at least one element of the same group and a larger atomic radius than the solvent. The polycrystalline rod 21 is located above the solution 26.

By means of the device 27, for example, a heating coil for high-frequency current, a temperature gradient is applied to the contents of the tube 22. The area immediately above the nucleus 25 where the solution is located at the beginning of the operation is heated to the crystallization temperature, the interface solution rod being at a temperature which is higher than that at which the solid component is soluble in the liquid component.

Figure 6:
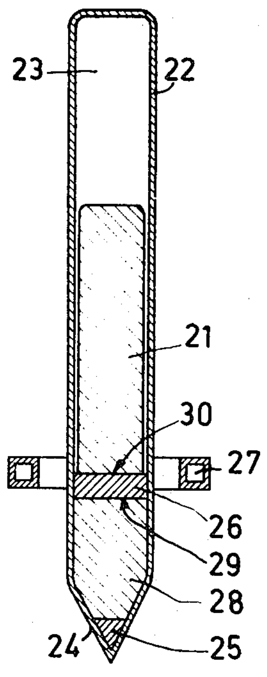
FIG. 6 is a diagrammatic and simplified vertical cross-sectional view of a device for performing the invention by zone melting.

FIG. 6 shows the device during the deposition; the nucleus 25 is elongated by the epitaxial deposit 28 which is formed continuously by crystallization at the interface 29. Simultaneously the rod 21 is dissolved in the interface 30 and the device 27 is moved in an upward direction with respect to the tube 22 in accordance with the rate of deposition and dissolution. The liquid region 26 thus progresses regularly and the thickness of the deposit simultaneously increases until a single crystal of a considerable volume has been formed.

The volume of the solution in this embodiment is very restricted and the quantity of the addition used which is dependent upon the weight of the solvent present in the liquid phase is very small. This element nevertheless influences the nucleation as in the other embodiment without substantially penetrating into the crystal lattice of the deposited compound, and the concentration remains substantially constant.

The various above-described embodiments and the devices described are only examples which serve to illustrate the possible applications of the method according to the invention. However, the invention is neither restricted to these embodiments nor to these devices. Other embodiments and other devices which are known in semiconductor technology and serve to handle single crystals starting from a solution from the liquid phase of a compound in one of its components, may alternatively be used while taking into account the method according to the invention.

Within the scope of this invention, many variations are possible to those skilled in the art.

For example, instead of indium for these same deposits starting from a solution in gallium, another element may be used which satisfies the same conditions of valency and atom radius, for example, gallium, lanthanum or a lanthanide. Alternatively, a gallium phosphide deposit according to the invention may be improved, for example, by the addition of indium to the solution. Alternatively, for example, the crystallization of indium arsenide may be improved by the addition of thallium.

Of course, the method according to the invention may be used for the crystallization of crystallizable semiconductor binary compounds other than those which were chosen as examples, and particularly for deposits of other so-called III–V compounds and for depositing the so-called II–VI compounds, in particular so-called IV–VI compounds.

What is claimed is:

1. A method of crystallizing a binary semiconductor compound from a liquid solution of the compound in one of its components comprising the steps of adding to a liquid solution of an $A^{III}$,$B^{V}$-compound in the $A^{III}$-component an element of the third group of the periodic system and having a larger atomic radius than the $A^{III}$-component, and cooling the solution to crystallize the binary compound therefrom.

2. A method as claimed in claim 1, wherein the semiconductor compound is epitaxially provided on a semiconductor body.

3. A method as claimed in claim 2, characterized in that the semiconductor body consists of the semiconductor compound.

4. A method as claimed in claim 1, wherein the starting material is a liquid solution of gallium arsenide in gallium.

5. A method as claimed in claim 4, wherein the concentration of the gallium arsenide with respect to the gallium lies between 3 and 20 percent by weight.

6. A method as claimed in claim 5, wherein the concentration of the gallium arsenide with respect to the gallium lies between 5 and 10 percent by weight.

7. A method as claimed in claim 4, wherein indium is the added element.

8. A method as claimed in claim 7, wherein maximally 5 percent by weight is used as the concentration of the indium with respect to the gallium.

9. A method as claimed in claim 8, wherein the indium concentration with respect to the gallium lies between 1 and 3 percent by weight.

10. A method as claimed in claim 9, wherein the solution is prepared in one part of a vessel and heated at a temperature which lies above the saturation temperature and the semiconductor body is placed in another part of the vessel, after which the vessel is tilted, in such manner that the solution contacts the semiconductor body, and is cooled.

11. A method as claimed in claim 10, wherein the temperature of the solution lies 20° to 50° C. above the saturation temperature.

12. A method as claimed in claim 11, wherein the rate of cooling lies between 0.1° and 50° C. per minute.

13. A method as claimed in any of the claim 9, wherein a crystalline body is obtained from the semiconductor compound by drawing from the solution.

14. A method as claimed in any of the claim 9, wherein during crystallization the concentration in the melt of the component other than the solvent is maintained by bringing the other component at a location in the solution where a temperature prevails which is higher than at the location where crystallization takes place.

15. A method as claimed in claim 14, wherein the other component is introduced in the solution via a vapor phase.

16. A method as claimed in claim 15, wherein the other component is introduced into a crystallization vessel, in which crystallization takes place, through a porous wall.

17. A method as claimed in any of the claim 9, wherein the crystallization takes place in a zone melting process.

* * * * *